United States Patent
Chen

(10) Patent No.: US 10,566,322 B2
(45) Date of Patent: Feb. 18, 2020

(54) OPTOELECTRONIC SEMICONDUCTOR DEVICE

(71) Applicant: ULTRA DISPLAY TECHNOLOGY CORP., Taipei (TW)

(72) Inventor: Hsien-Te Chen, Taipei (TW)

(73) Assignee: ULTRA DISPLAY TECHNOLOGY CORP., Taipei (TW)

( * ) Notice: Subject to any disclaimer, the term of this patent is extended or adjusted under 35 U.S.C. 154(b) by 14 days.

(21) Appl. No.: 15/624,484

(22) Filed: Jun. 15, 2017

(65) Prior Publication Data

US 2017/0365588 A1  Dec. 21, 2017

(30) Foreign Application Priority Data

Jun. 17, 2016 (TW) .............................. 105119178 A

(51) Int. Cl.

| | |
|---|---|
| H01L 25/16 | (2006.01) |
| H01L 27/12 | (2006.01) |
| H01L 31/02 | (2006.01) |
| H01L 31/0224 | (2006.01) |
| H01L 31/0232 | (2014.01) |
| H01L 31/173 | (2006.01) |
| H01L 33/00 | (2010.01) |
| H01L 33/36 | (2010.01) |
| H01L 33/50 | (2010.01) |
| H01L 33/62 | (2010.01) |
| G06K 9/00 | (2006.01) |
| H01L 25/075 | (2006.01) |

(52) U.S. Cl.
CPC ........ *H01L 25/167* (2013.01); *H01L 25/0753* (2013.01); *H01L 27/1214* (2013.01); *H01L 31/02005* (2013.01); *H01L 31/02322* (2013.01); *H01L 31/02327* (2013.01); *H01L 31/022408* (2013.01); *H01L 31/173* (2013.01); *H01L 33/0095* (2013.01); *H01L 33/36* (2013.01); *H01L 33/505* (2013.01); *H01L 33/62* (2013.01); *G06K 9/0004* (2013.01)

(58) Field of Classification Search
CPC ............... H01L 25/167; H01L 25/0753; H01L 27/1214; H01L 31/02005; H01L 31/02322
See application file for complete search history.

(56) References Cited

U.S. PATENT DOCUMENTS

| | | | |
|---|---|---|---|
| 2007/0262328 A1* | 11/2007 | Bando ..................... | H01L 24/97 257/79 |
| 2007/0267646 A1* | 11/2007 | Wierer, Jr. ............. | B82Y 20/00 257/98 |
| 2012/0086024 A1* | 4/2012 | Andrews ............ | H01L 25/0753 257/88 |

(Continued)

*Primary Examiner* — Zandra V Smith
*Assistant Examiner* — Andre C Stevenson
(74) *Attorney, Agent, or Firm* — Muncy, Geissler, Olds & Lowe, P.C.

(57) ABSTRACT

An optoelectronic semiconductor device includes an epitaxial substrate and a plurality of microsized optoelectronic semiconductor elements. The microsized optoelectronic semiconductor elements are disposed separately and disposed on a surface of the epitaxial substrate. A length of a side of each of the microsized optoelectronic semiconductor elements is between 1 μm and 100 μm, and a minimum interval between two adjacent microsized optoelectronic semiconductor elements is 1 μm.

20 Claims, 4 Drawing Sheets

(56) References Cited

U.S. PATENT DOCUMENTS

| | | | |
|---|---|---|---|
| 2015/0034978 A1* | 2/2015 | Hussell | H01L 25/0753 257/89 |
| 2015/0084537 A1* | 3/2015 | Choi | H01L 33/20 315/250 |
| 2015/0187740 A1* | 7/2015 | McGroddy | H01L 25/0753 345/82 |
| 2015/0333241 A1* | 11/2015 | Chen | H01L 33/62 257/93 |

* cited by examiner

OPTOELECTRONIC SEMICONDUCTOR DEVICE

CROSS REFERENCE TO RELATED APPLICATIONS

This Non-provisional application claims priority under 35 U.S.C. § 119(a) on Patent Application No(s). 105119178 filed in Taiwan, Republic of China on Jun. 17, 2016, the entire contents of which are hereby incorporated by reference.

BACKGROUND OF THE INVENTION

Field of Invention

The invention relates to a semiconductor device and, in particular, to an optoelectronic semiconductor device.

Related Art

In comparison with the conventional liquid crystal display device, the micro LED array display composed of micro LEDs (μLEDs) is more contributive to the purposes of lightness and thinness because it doesn't require an additional backlight source.

In the conventional procedure of manufacturing an optoelectronic device (such as a display) by using LEDs (the length of a side is greater than 100 μm), the epitaxial process is used to form LEDs, and then the half cutting (electrical insulation), probing and full cutting are performed to obtain the individual LEDs, which are subsequently transferred to a carrying substrate. Then, one or more LEDs are picked up from the carrying substrate by a pick-up head to be transferred to, for example, the matrix circuit substrate for the subsequent processes. However, with regard to the μLEDs, because they have a smaller size in the length of a side (such as 25 μm or less), when they are used to form the optoelectronic device in the manufacturing procedure the same as mentioned above, they require a higher manufacturing accuracy of the equipment and a higher cost, and therefore the manufacturing time and cost of the optoelectronic device will be increased. Moreover, because the conventional LEDs have a larger size (the length of a side exceeds 100 μm), when they are used for manufacturing the optoelectronic device by using the above-mentioned procedure, the resolution of the optoelectronic device will be limited for being limited by the manufacturing accuracy of the equipment.

SUMMARY OF THE INVENTION

An objective of the invention is to provide an optoelectronic semiconductor device. The optoelectronic semiconductor device of this invention can be applied to different fields according to the design requirement, and also can be reduced in the manufacturing time and cost in comparison with the conventional optoelectronic device manufactured by using LEDs. Furthermore, the optoelectronic semiconductor device of this invention is more suitable for the application of manufacturing the electronic device with a higher resolution.

To achieve the above objective, an optoelectronic semiconductor device according to the invention comprises an epitaxial substrate and a plurality of microsized optoelectronic semiconductor elements. The microsized optoelectronic semiconductor elements are disposed separately and disposed on a surface of the epitaxial substrate. A length of a side of each of the microsized optoelectronic semiconductor elements is between 1 μm and 100 μm, and a minimum interval between two adjacent microsized optoelectronic semiconductor elements is 1 μm.

In one embodiment, the epitaxial substrate is a sapphire substrate, a GaAs substrate or a SiC substrate.

In one embodiment, the optoelectronic semiconductor device is obtained by cutting after an epitaxial wafer undergoes an epitaxial process to obtain the microsized optoelectronic semiconductor elements.

In one embodiment, the optoelectronic semiconductor device further comprises a conducting circuit. The conducting circuit is disposed on the surface of the epitaxial substrate and electrically connected with an electrode of the microsized optoelectronic semiconductor element.

In one embodiment, the microsized optoelectronic semiconductor elements include a light-emitting element and a light-receiving element.

In one embodiment, when a first voltage is provided for the microsized optoelectronic semiconductor element, the microsized optoelectronic semiconductor element is a light-emitting element. When a second voltage is provided for the microsized optoelectronic semiconductor element, the microsized optoelectronic semiconductor element is a light-receiving element. The first voltage and the second voltage have opposite polarities.

In one embodiment, the light-emitting element and the light-receiving element are disposed adjacent to each other.

In one embodiment, the optoelectronic semiconductor device further comprises an active matrix substrate. The active matrix substrate is disposed opposite to the epitaxial substrate and includes a matrix circuit and a substrate. The matrix circuit is disposed on the substrate and faces the surface of the epitaxial substrate.

In one embodiment, each of the microsized optoelectronic semiconductor elements includes a first electrode and a second electrode. The matrix circuit includes a plurality of third electrodes and a plurality of fourth electrodes. The first electrodes are electrically connected with the third electrodes respectively, and the second electrodes are electrically connected with the fourth electrodes respectively.

In one embodiment, the optoelectronic semiconductor device further comprises a photoluminescence layer. The photoluminescence layer is disposed on a side of the epitaxial substrate farther from the microsized optoelectronic semiconductor elements.

In one embodiment, the photoluminescence layer is a quantum dots structure layer or a phosphor layer.

In one embodiment, the optoelectronic semiconductor device further comprises a filter substrate disposed on a side of the photoluminescence layer farther from the epitaxial substrate.

In one embodiment, the filter substrate includes a plurality of filter portions, which correspond to the microsized optoelectronic semiconductor elements respectively.

As mentioned above, in the optoelectronic semiconductor device, a plurality of microsized optoelectronic semiconductor elements are disposed apart from each other and on the epitaxial substrate, wherein the length of a side of each of the microsized optoelectronic semiconductor elements is between 1 μm and 100 μm and a minimum interval between two adjacent microsized optoelectronic semiconductor elements is 1 μm. Thereby, in comparison with the conventional optoelectronic device manufactured by LEDs, the optoelectronic semiconductor device of this invention can be applied to different fields according to the design requirement and also reduced in the manufacturing time and cost. Furthermore, the optoelectronic semiconductor devices of this invention are more suitable for the application of manufacturing the electronic device with a higher resolution, such as the VR or AR head-mounted display.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The embodiments of the optoelectronic semiconductor device of this invention will be illustrated with reference to the figures, in which the same references relate to the same elements. The all figures of the embodiments are given for illustration only and not for representing the actual size and ratio. Besides, the terms used to describe the position such as "up" and "down" are only for representing the relative position. Moreover, the description of that one element is formed "on", "above", "below", or "under" another element can comprise one embodiment wherein one element directly contacts another element or another embodiment where an additional element is disposed between one element and another element so that the one element and the another element don't contact each other directly. Besides, the optoelectronic semiconductor device described in the following embodiments can be applied to a sensing device (e.g. a fingerprint or palmprint recognition device), a touch control device, a display device, a micro projector, or an illuminating device. The display device can be, for example, a virtual reality (VR) head-mounted display or an augmented reality (AR) head-mounted display, and this invention is not limited thereto.

Figure 1A:
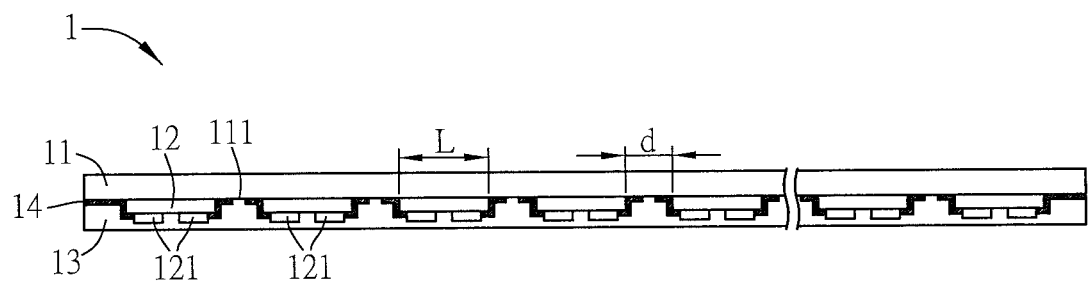
FIG. 1A is a schematic diagram of an optoelectronic semiconductor device of an embodiment of the invention.

Please refer to FIG. 1A, which is a schematic diagram of an optoelectronic semiconductor device 1 of an embodiment of the invention.

The optoelectronic semiconductor device 1 includes an epitaxial substrate 11 and a plurality of microsized optoelectronic semiconductor elements 12.

The epitaxial substrate 11 is made of transparent material, which can be, for example, sapphire, GaAs, or SiC. The epitaxial substrate 11 of this embodiment is a transparent wafer of a sapphire substrate for example.

The microsized optoelectronic semiconductor elements 12 are disposed on a surface 111 of the epitaxial substrate 11 and apart from each other. The microsized optoelectronic semiconductor elements 12 can be arranged in an array (a two dimensional array for example) to be disposed on the epitaxial substrate 11, or arranged in a staggered manner to be disposed on the epitaxial substrate 11, but this invention is not limited thereto. A preferable case is a two dimensional array arrangement. The length of a side L of each of the microsized optoelectronic semiconductor elements 12 is between 1 μm and 100 μm. In one embodiment, one of the microsized optoelectronic semiconductor elements 12 can be 25 μm×25 m, and a minimum interval d between two adjacent microsized optoelectronic semiconductor elements 12 is, for example but not limited to, 1 μm.

In this embodiment, the material of the microsized optoelectronic semiconductor elements 12 is, for example but not limited to, GaN, and it can be formed on the epitaxial substrate 11 by the epitaxial method. For example, the microsized optoelectronic semiconductor elements 12 can be formed on the epitaxial substrate 11 by the epitaxial process by using MOCVD (Metal-organic Chemical Vapor Deposition). In different embodiments, the microsized optoelectronic semiconductor elements 12 can have other materials, such as AlGaAs, GaP, GaAsP, AlGaInP, or GaN, and this invention is not limited thereto.

Moreover, the microsized optoelectronic semiconductor element 12 can be a dual-electrode element or a triple-electrode element. The dual-electrode element can be a light-emitting element, such as an LED. The dual-electrode element also can be a light-receiving element, such as a photo diode. The triple-electrode is a transistor for example. The microsized optoelectronic semiconductor element 12 of this embodiment is a micro LED (μLED) for example. The electrode arrangement of the LED can be that the p electrode and n electrode are disposed on the same side (the horizontal structure) or that the p electrode and the n electrode are respectively disposed on the up side and the down side (the type of the up and down sides conductive to each other, or the vertical structure). The microsized optoelectronic semiconductor element 12 of this embodiment is a μLED of horizontal structure for example. Moreover, with regard to the category of the displayed color, when the microsized optoelectronic semiconductor element 12 is a μLED, it can be a blue LED, a red LED, a green LED, an infrared LED, an ultraviolet LED, or their any combination.

In this embodiment, the optoelectronic semiconductor device 1 further includes a sealing layer 13. The sealing layer 13 possesses the adhesive property or the sealing property, and is disposed on the microsized optoelectronic semiconductor elements 12 and the surface 111 of the epitaxial substrate 11 to cover the microsized optoelectronic semiconductor elements 12. The sealing layer 13 of this embodiment is, for example but not limited to, an insulating adhesive or sealant. The adhesive or sealant can be transparent epoxy resin or silicone, or can be a thermosetting adhesive or a light curing adhesive, or their any combination. In different embodiments, the sealing layer 13 also can be a film type adhesive material such as anisotropic conductive film (ACF) or anisotropic conductive paste (ACP), and the related description will be given below.

The optoelectronic semiconductor device 1 of this embodiment further includes at least a conducting circuit 14, which is disposed on the surface 111 of the epitaxial substrate 11 and electrically connected with an electrode 121 (p electrode or n electrode) of the microsized optoelectronic semiconductor element 12. In this embodiment for example, a plurality of the conducting circuits 14 are disposed on the surface 111 of the epitaxial substrate 11 and electrically connected with the electrodes 121 of the microsized optoelectronic semiconductor elements 12 respectively, so as to be electrically connected with a driving circuit (not shown) on the outside. Herein, the conducting circuits 14 are driving traces of the microsized optoelectronic semiconductor elements 12. By the driving circuit and the conducting circuits 14 electrically connected with the electrodes 121 of the microsized optoelectronic semiconductor elements 12, the optoelectronic semiconductor device 1 becomes a passive matrix optoelectronic device. Therefore, the driving circuit can drive the microsized optoelectronic semiconductor elements 12 respectively through the conducting circuits 14. Since the driving circuit driving LEDs is prior art and also not the emphasis of this invention, the description thereof is omitted for conciseness. Moreover, in this embodiment, after the conducting circuits 14 are formed, the conducting circuits 14 and the microsized optoelectronic semiconductor elements 12 are sealed by the sealing layer 13, so as to avoid the entrance of moisture or foreign objects and thus to avoid the accompanying damage.

Furthermore, the structure of the microsized optoelectronic semiconductor elements 12 separately disposed on the epitaxial substrate 11 is obtained by the procedure where an epitaxial wafer undergoes the epitaxial process and the photolithography process to obtain the microsized optoelectronic semiconductor elements 12 and then the cutting is performed according to the required size of the application or design. However, in the conventional manufacturing procedure of LED, a wafer undergoes the epitaxial, coating, photolithography and etching processes to obtain a plurality of LEDs and then the half cutting (electrical insulation), probing and full cutting are performed to obtain the individual LEDs, which are then transferred to a carrying substrate. When an optoelectronic device needs to be manufactured, one or several LEDs are transferred to a substrate for the subsequent processes. By contrast, the optoelectronic semiconductor device 1 of this embodiment is obtained by the procedure where an epitaxial wafer undergoes the epitaxial, coating, photolithography and etching process to obtain a plurality of μLEDs and then the epitaxial substrate is cut directly according to the required size of the application or design. For example, in some embodiments, if a sensing device (such as a fingerprint recognition device) needs to be manufactured, the wafer can be directly cut to the size of 1 cm×1 cm and then the circuit and sealing processes can be applied thereto. Or, in another embodiment, if a display device (such as a VR head-mounted display or an AR head-mounted display; a single-color display or a full-color display) needs to be manufactured, the wafer can be cut to obtain a rectangle with the diagonal of 10 cm for example and then the subsequent process can be performed. Therefore, in comparison with the prior art, the optoelectronic semiconductor device 1 of this embodiment can be applied to different technical fields according to the design requirement and also reduced in the manufacturing time and cost.

With regard to the VR or AR head-mounted display, they are formed by using OLEDs in the conventional art. However, because the density of disposition of the OLED has its limit, the resolution of the VR or AR display is limited considerably. In contrast with the prior art, the optoelectronic semiconductor device of this invention is obtained by applying the cutting to the μLEDs formed on the epitaxial substrate (a considerable number of μLEDs are formed on the epitaxial substrate). Since the size of μLED is very small, the density of disposition thereof can be very high. Therefore, the manufactured optoelectronic semiconductor device 1 can have a higher resolution, so as to be suitable for the manufacturing of the VR or AR head-mounted display with a high resolution.

Figure 2A:
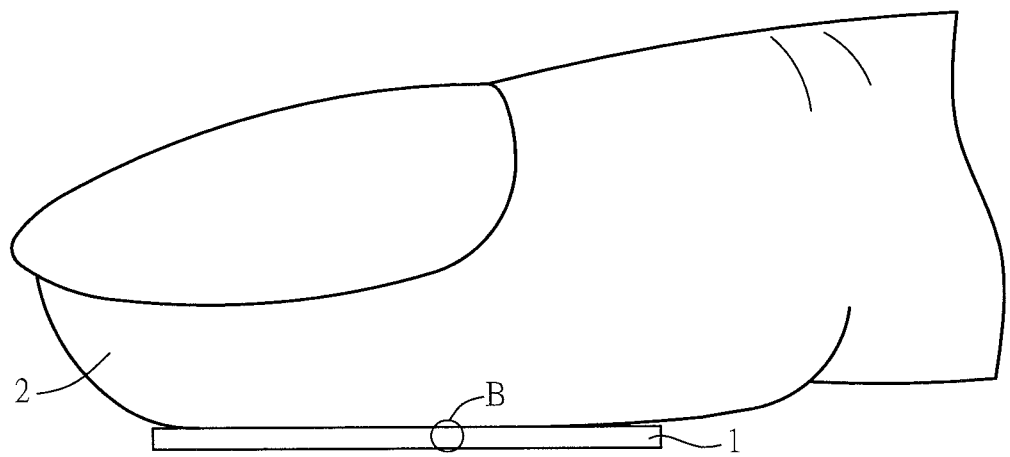
FIG. 2A is a schematic diagram of an application of the optoelectronic semiconductor device of an embodiment of the invention.
Figure 2B:
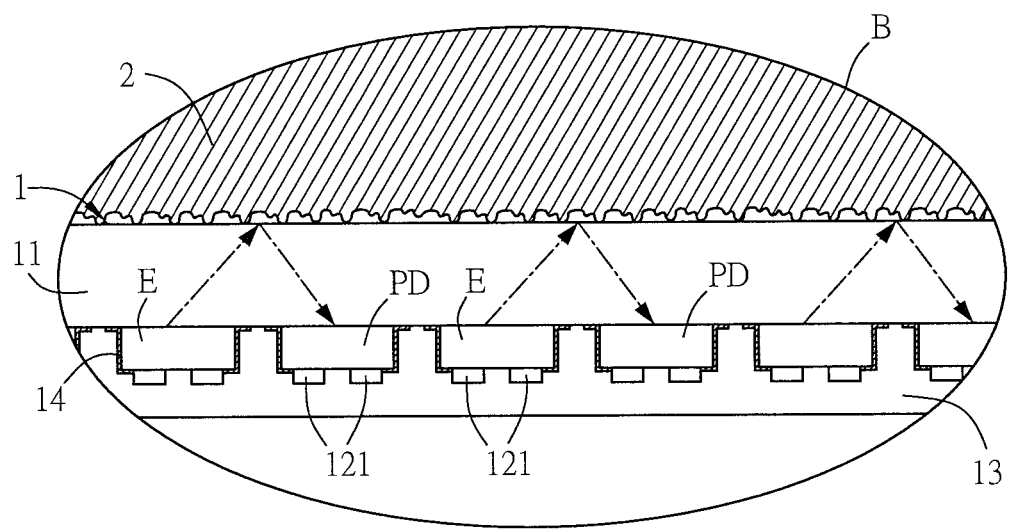
FIG. 2B is a schematic enlarged diagram of a region in FIG. 2A.

Please refer to FIGS. 2A and 2B, wherein FIG. 2A is a schematic diagram of an application of the optoelectronic semiconductor device 1 of an embodiment of the invention and FIG. 2B is a schematic enlarged diagram of the region B in FIG. 2A. Herein, the size of the optoelectronic semiconductor device 1 is 1 cm×1 cm for example and is applied to become a fingerprint recognition device.

In order to apply the optoelectronic semiconductor device 1 to the fingerprint recognition, the microsized optoelectronic semiconductor elements 12 need to include a light-emitting element E and a light-receiving element PD. When the voltage of different polarity is provided for the microsized optoelectronic semiconductor element 12 through the conducting circuit 14, the microsized optoelectronic semiconductor element 12 can be made the light-emitting element E or the light-receiving element PD. Physically, when the positive-polarity voltage (called the first voltage herein) is provided for the positive pole of the microsized optoelectronic semiconductor element 12 through the power (i.e. the forward bias), the microsized optoelectronic semiconductor element 12 can be made the light-emitting element E (LED); and when the opposite negative-polarity voltage (called the second voltage herein, which may have the absolute value the same as or different from the first voltage but has the opposite polarity to the first voltage) is provided for the positive pole of the microsized optoelectronic semiconductor element 12 (i.e. the reverse bias), the microsized optoelectronic semiconductor element 12 can be made the light-receiving element PD (photodiode). The principle thereof is: when the forward bias is applied, the electrons and the electron holes in the microsized optoelectronic semiconductor element 12 move through the depletion region of the p-n junction to generate a current and the electron-hole pair combines near the depletion region to generate the light (LED); when the reverse bias is applied and the light reaches the LED, the electron-hole pair will be generated in the depletion region and the reverse bias will make the electron move to N pole while the hole moves to P pole, so that the current is generated and the microsized optoelectronic semiconductor element 12 becomes the photodiode (the light-receiving element PD). Therefore, after the light is emitted by the light-emitting element E and then reflected through the uneven print of the fingerprint (peak and trough), the light-receiving element PD can generate different current values, whereby the print of the fingerprint can be recognized.

As shown in FIG. 2B, the light-emitting element E and the light-receiving element PD of the optoelectronic semiconductor device 1 of this embodiment are disposed adjacent to each other, but this invention is not limited thereto. In different embodiments, a region can function as the light-emitting element E while another region functions as the light-receiving element PD. Or, the all microsized optoelectronic semiconductor elements 12 function as the light-emitting element E within a period of time and function as the light-receiving element PD within another period of time by changing the bias.

Therefore, when a finger 2 presses the optoelectronic semiconductor device 1 for the detection, since the fingerprint has an uneven print, the light emitted by the light-emitting element E will reach the fingerprint of the finger 2 and then be reflected, diffused, refracted or scattered through the uneven print. Afterwards, the lights of different strengths can be received by the light-receiving element PD to generate different sensing signals (sensing currents), and these sensing signals can be read out through the conducting circuits 14 and be compared with the pre-stored signals (which correspond to the pre-stored fingerprint and can be preset before the detection). When the detected sensing signal is the same as the pre-stored signal, the subsequent action can be conducted so as to achieve the purpose of fingerprint characteristic recognition.

Figure 1B:
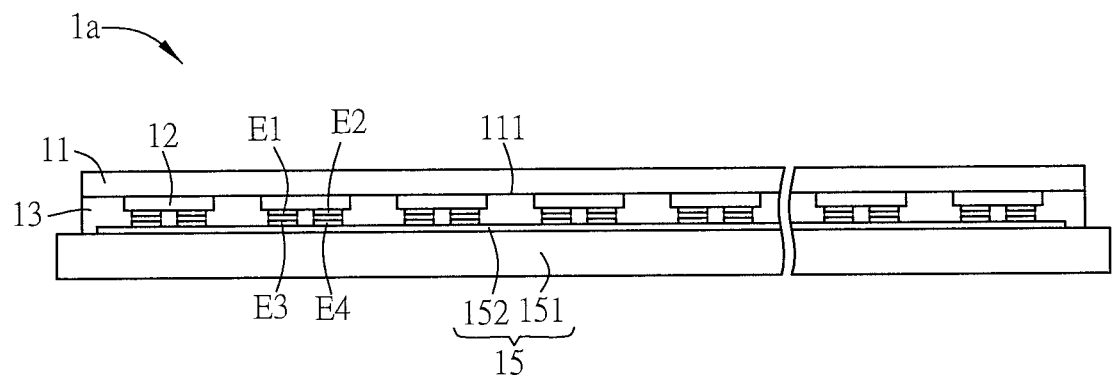
FIGS. 1B, 1C, 3A to 3C are schematic diagrams of the optoelectronic semiconductor devices of different embodiments of the invention.
Figure 1C:
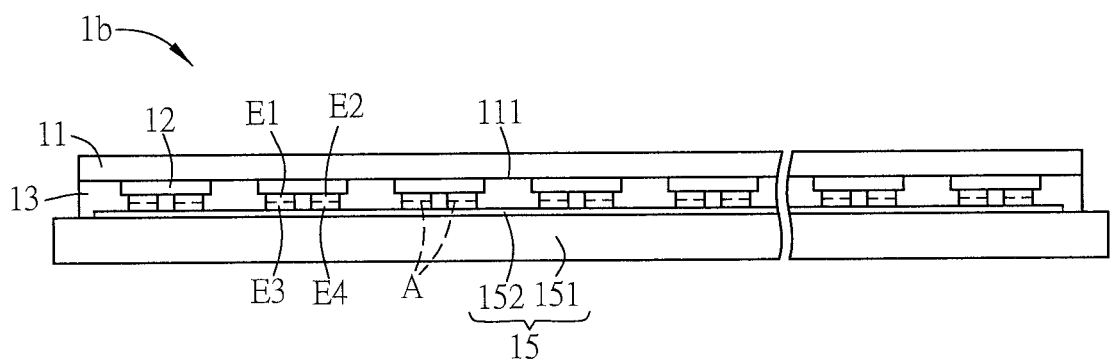

Please refer to FIGS. 1B and 1C, which are schematic diagrams of the optoelectronic semiconductor devices 1a and 1b of different embodiments of the invention.

In FIG. 1B, in addition to the epitaxial substrate 11, the microsized optoelectronic semiconductor elements 12 and the sealing layer 13 of the optoelectronic semiconductor device 1 of FIG. 1A, the optoelectronic semiconductor device 1a further includes an active matrix substrate 15. But, the optoelectronic semiconductor device 1a doesn't include the conducting circuit 14. The active matrix substrate 15 is disposed opposite to the epitaxial substrate 11 and includes a matrix circuit 152 and a substrate 151. In this embodiment, the substrate 151 can have transparent material, such as glass, quartz or the like, plastic material, rubber, fiberglass or other polymer material, and preferably can be an alumino silicate glass substrate. The matrix circuit 152 is disposed on the substrate 151 and faces the surface 111 of the epitaxial substrate 11. The active matrix substrate 15 can be the active matrix substrate of a liquid crystal display device where the data lines, the scan lines intersecting the data lines and the active elements (such as TFTs) are formed. Since the driving circuit and the matrix circuit 152 of the active matrix substrate 15 are prior art and not the emphasis of this invention and the related content can be found by those skilled in the art, the related description is omitted here for conciseness.

In this embodiment, each of the microsized optoelectronic semiconductor elements 12 includes a first electrode E1 and a second electrode E2. The matrix circuit 152 includes a plurality of third electrodes E3 and a plurality of fourth electrodes E4. The first electrodes E1 are electrically connected with the third electrodes E3 respectively, and the second electrodes E2 are electrically connected with the fourth electrodes E4 respectively. The above-mentioned electrical connection can include "direct electrical connection" or "indirect electrical connection". The direct electrical connection means the direct connection is achieved without by another element or material, for example, by using laser spot welding to connect both. The indirect electrical connection means the electrical connection is achieved by the connection of another element.

In this embodiment, for example, the sealing layer 13 is disposed to achieve the indirect electrical connection. The sealing layer 13 is ACF or ACP. The first electrodes E1 are connected with the third electrodes E3 through the sealing layer 13 respectively, and the second electrodes E2 are connected with the fourth electrodes E4 through the sealing layer 13 respectively. In addition to providing the connection for the electrical connection, the sealing layer 13 can further provide the effects of sealing and protection.

In FIG. 1C, the optoelectronic semiconductor device 1b also include the elements in FIG. 1B. However, the main difference from the optoelectronic semiconductor device 1a is in that, in the optoelectronic semiconductor device 1b of this embodiment, the laser spot welding is used to achieve the direct connection and the electrical connection between the first electrodes E1 and the third electrodes E3 and between the second electrodes E2 and the fourth electrodes E4. Moreover, the sealing layer 13 of this embodiment can be an adhesive or a sealant to protect the optoelectronic semiconductor device 1b from the contamination of moisture or foreign objects.

Because of using the laser spot welding, the scorch and carbonization will formed on the junction A of the two electrodes. Therefore, in some embodiments, the reflectivity of the junction A between the first electrode E1 and the third electrode E3 or the reflectivity of the junction A between the second electrode E2 and the fourth electrode E4 will be less than 20%. In other embodiments, the reflectivity of the junction A of the two electrodes may be between 10% and 20% and even below 10%.

Other technical contents of the optoelectronic semiconductor devices 1a and 1b have been illustrated in the above mention, so the related description can be comprehended by referring to the same elements of the optoelectronic semiconductor device 1 and is omitted here for conciseness.

Figure 2C:
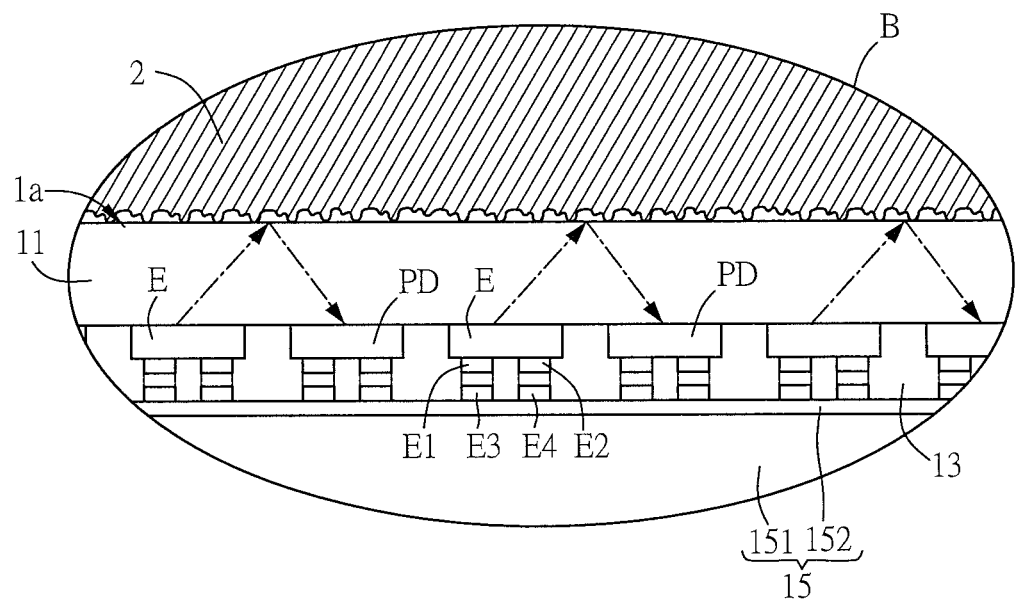
FIGS. 2C and 2D are schematic diagrams of the application of the optoelectronic semiconductor devices of different embodiments of the invention.
Figure 2D:
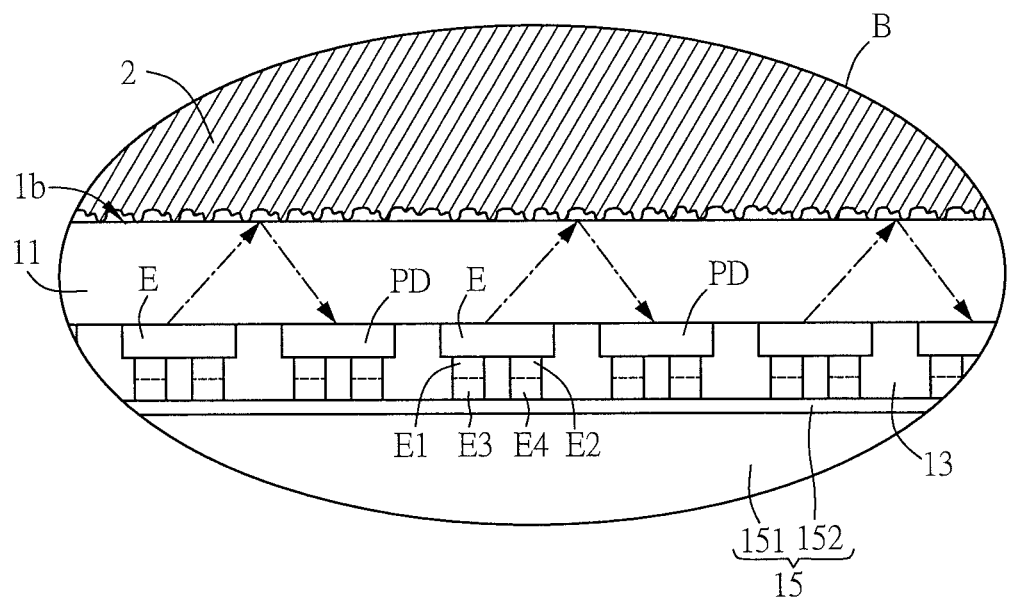

Please refer to FIGS. 2C and 2D, which are schematic diagrams of the application of the optoelectronic semiconductor devices of different embodiments of the invention. Herein, the same as the optoelectronic semiconductor device 1, the optoelectronic semiconductor devices 1a and 1b are also applied to the fingerprint recognition.

As shown in FIGS. 2C and 2D, similarly, the light-emitting element E and the light-receiving element PD of the optoelectronic semiconductor devices 1a and 1b are disposed adjacent to each other. Therefore, when the finger 2 presses the optoelectronic semiconductor devices 1a and 1b for the detection, the light of different strengths resulted from the reflection, diffusion, refraction or scattering on uneven print of the finger can be received by the light-receiving elements PD, so as to generate different sensing signals (sensing currents). These sensing signals can be read out through the matrix circuit 152 and be compared with the pre-stored signals (which correspond to the pre-stored fingerprint and can be preset before the detection). Thereby, the purpose of fingerprint characteristic recognition can be achieved.

The above-mentioned optoelectronic semiconductor devices 1, 1a and 1b are applied to the fingerprint recognition for example. In different embodiments, the optoelectronic semiconductor devices 1, 1a and 1b can include the same microsized optoelectronic semiconductor elements 12, such as the μLEDs capable of emitting blue light. Therefore, when the optoelectronic semiconductor devices 1, 1a and 1b are configured with a filter layer of the same color, they can be applied to become a monochrome display panel. When the display panel needs to be manufactured for displaying different colors, the microsized optoelectronic semiconductor elements 12 can be correspondingly configured with the filter layers of different colors. When a full-color display is manufactured, a plurality of sub-pixel regions can be correspondingly configured with the filter layers of three different colors, so that the sub-pixel regions can emit the lights of three primary colors.

Figure 3A:
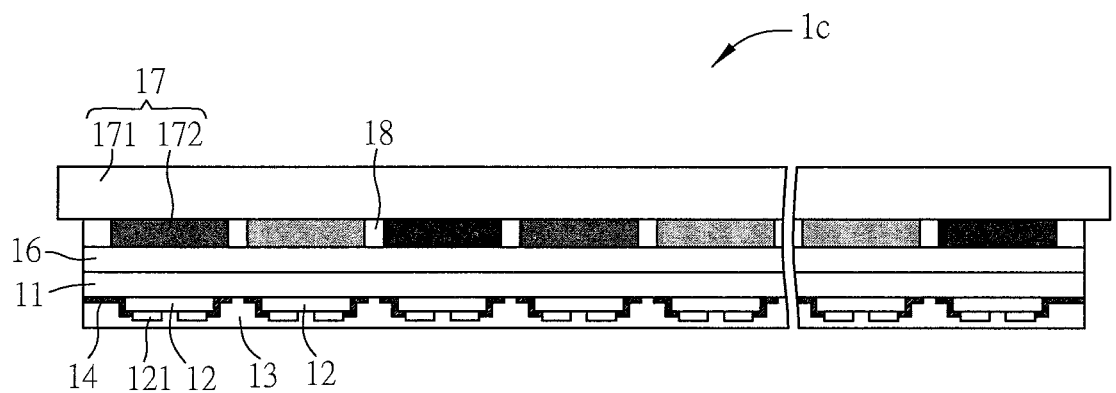
Figure 3B:
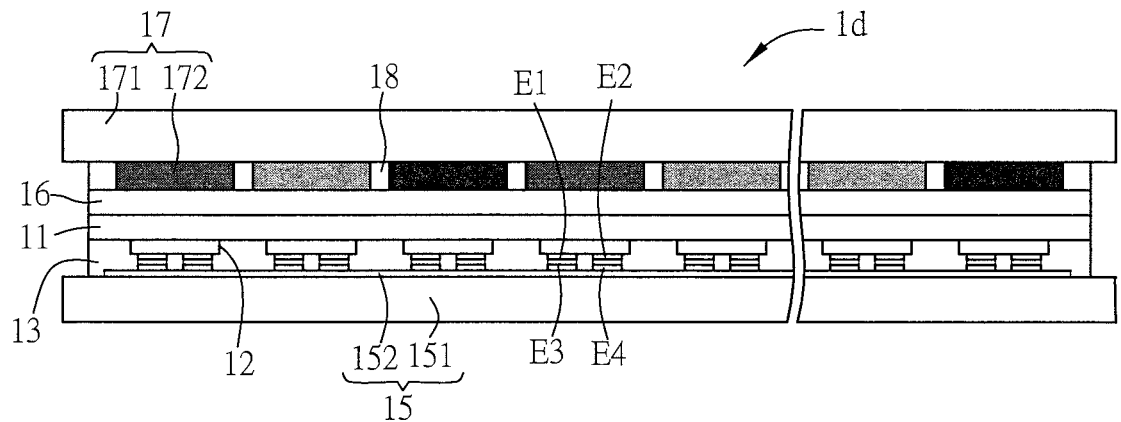
Figure 3C:
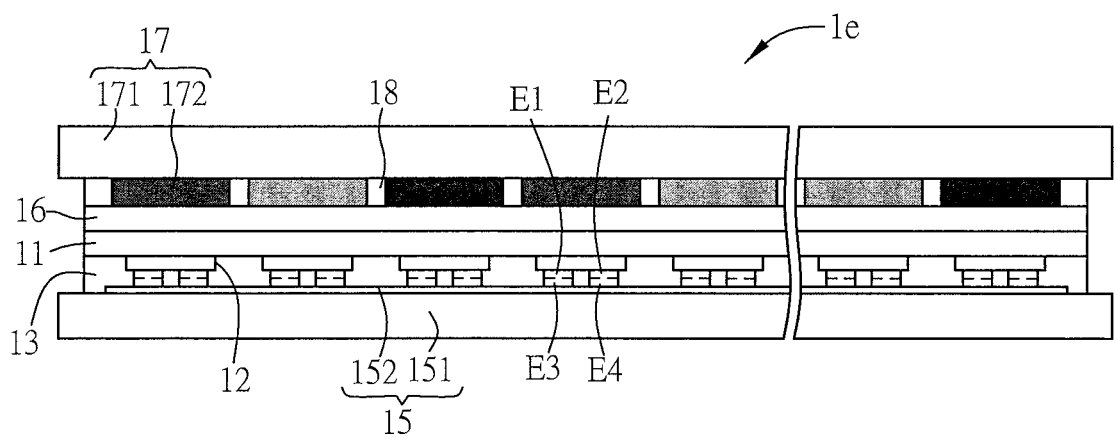

Please refer to FIGS. 3A to 3C, which are schematic diagrams of the optoelectronic semiconductor devices 1c, 1d and 1e of different embodiments of the invention. Herein, the optoelectronic semiconductor devices 1c, 1d and 1 are full-color display panels for example, and the size thereof is, for example but not limited to, like a rectangle with the diagonal of 10 cm, so as to be applied to the VR or AR head-mounted display for example.

In addition to the elements and structures of the optoelectronic semiconductor device 1 of FIG. 1A, the optoelectronic semiconductor device 1c of FIG. 3A further includes a photoluminescence layer 16, a filter substrate 17 and a light-mix prevention layer 18.

The photoluminescence layer 16 is disposed on the side of the epitaxial substrate 11 farther from the microsized optoelectronic semiconductor elements 12. Herein, the photoluminescence layer 16 is attached on the upper surface of the epitaxial substrate 11 by using OCA (optical clear adhesive, not shown). The photoluminescence layer 16 can be a quantum dots structure layer or a phosphor layer. For example, the photoluminescence layer 16 of this embodiment is a quantum dots structure layer, which can absorb the high-energy light (such as blue light) emitted by the microsized optoelectronic semiconductor elements 12. When the quantum dots have a larger size, they can absorb blue light to emit red light. When the quantum dots have a smaller size, they can absorb blue light to emit green light. Therefore, the blue light, the red light and the green light are mixed to emit the visible light (white light). In different embodiments, when the microsized optoelectronic semiconductor elements 12 emit the white light, the photoluminescence layer 16 can be a phosphor layer to generate the red light, the green light and the blue light.

The filter substrate 17 is disposed on the side of the photoluminescence layer 16 farther from the epitaxial substrate 11. Herein, the filter substrate 17 is disposed on the upper surface of the photoluminescence layer 16 and includes a transparent substrate 171 and a plurality of filter portions 172. The filter portions 172 are disposed on the surface of the transparent substrate 171 facing the photoluminescence layer 16, and are disposed corresponding to the microsized optoelectronic semiconductor elements 12 respectively. The transparent substrate 171 can be a hard plate or a soft plate, and this invention is not limited thereto. The filter portions 172 include red, green and blue filter portions 172 disposed in order, so as to generate the red, green and blue lights as the three primary colors. The light-mix prevention layer 18 is disposed on the transparent substrate 171 and disposed around the filter portions 172 to avoid the mix of the two adjacent lights of color. Therefore, in the optoelectronic semiconductor device 1c, a microsized optoelectronic semiconductor element 12 can correspond to a sub-pixel. Moreover, the filter substrate 17 and the light-mix prevention layer 18 can be the color filter (CF) substrate and the black matrix of a conventional liquid crystal display device, respectively, whereby the optoelectronic semiconductor device 1c can provide the effect of full color.

In addition to the elements and structures of the optoelectronic semiconductor device 1a of FIG. 1B, the optoelectronic semiconductor device 1d of FIG. 3B further includes the photoluminescence layer 16, the filter substrate 17 and the light-mix prevention layer 18. In addition to the elements and structures of the optoelectronic semiconductor device 1b of FIG. 1C, the optoelectronic semiconductor device 1e of FIG. 3C further includes the photoluminescence layer 16, the filter substrate 17 and the light-mix prevention layer 18. Herein, the technical contents of the photoluminescence layer 16, the filter substrate 17 and the light-mix prevention layer 18 have been illustrated in the embodiment of the optoelectronic semiconductor device 1c, so the related illustration is omitted here for conciseness.

Besides, other technical features of the optoelectronic semiconductor devices 1c, 1d and 1e can be comprehended by referring to the same elements of the above embodiments, and the related illustration is omitted here for conciseness.

Therefore, in comparison with the conventional VR or AR display device manufactured by OLEDs, because the microsized optoelectronic semiconductor elements 12 can have a higher density of disposition, the optoelectronic semiconductor devices 1c, 1d and 1e of the above embodiments are more suitable for the application of manufacturing the VR or AR display devices with a higher resolution.

In summary, in the optoelectronic semiconductor device, a plurality of microsized optoelectronic semiconductor elements are disposed apart from each other and on the epitaxial substrate, wherein the length of a side of each of the microsized optoelectronic semiconductor elements is between 1 µm and 100 µm and a minimum interval between two adjacent microsized optoelectronic semiconductor elements is 1 µm. Thereby, in comparison with the conventional optoelectronic device manufactured by LEDs, the optoelectronic semiconductor device of this invention can be applied to different fields according to the design requirement and also reduced in the manufacturing time and cost. Furthermore, the optoelectronic semiconductor devices of this invention are more suitable for the application of manufacturing the electronic device with a higher resolution, such as the VR or AR head-mounted display.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An optoelectronic semiconductor device, comprising:
a cut native epitaxial wafer;
a plurality of microsized epitaxial optoelectronic semiconductor elements arranged in a matrix, disposed separately and natively directly on a surface of the cut native epitaxial wafer, wherein a length of a side of each of the microsized epitaxial optoelectronic semiconductor elements is between 1 µm and 100 µm, and a minimum interval on the cut native epitaxial wafer between two adjacent microsized epitaxial optoelectronic semiconductor elements is 1 µm; and
a matrix circuit substrate, comprising:
an insulation substrate having a surface facing and supporting the cut native epitaxial wafer and the plurality of the microsized epitaxial optoelectronic semiconductor elements; and
a matrix circuit comprising a plurality of unit circuits on the surface of the insulation substrate, wherein the unit circuits of the matrix circuit directly faces and are electrically connected to respectively the plurality of the microsized epitaxial optoelectronic semiconductor elements arranged in the matrix natively directly on the surface of the cut native epitaxial wafer, and the microsized epitaxial optoelectronic semiconductor elements are between the matrix circuit and the cut native epitaxial wafer.

2. The optoelectronic semiconductor device as recited in claim 1, wherein the cut native epitaxial wafer is a sapphire wafer, a GaAs wafer or a SiC wafer, wherein the matrix circuit substrate is an active matrix substrate, and the matrix circuit is an active matrix circuit with thin film transistors or CMOS transistors.

3. The optoelectronic semiconductor device as recited in claim 1, which is obtained by cutting after an epitaxial wafer undergoes an epitaxial process to obtain the microsized epitaxial optoelectronic semiconductor elements, wherein the cut native epitaxial wafer is cut from the epitaxial wafer, and the microsized epitaxial optoelectronic semiconductor elements are epitaxially grown on the cut native epitaxial wafer.

4. The optoelectronic semiconductor device as recited in claim 1, further comprising:
a conducting circuit disposed on the surface of the cut native epitaxial wafer and electrically connected with an electrode of the microsized epitaxial optoelectronic semiconductor element.

5. The optoelectronic semiconductor device as recited in claim 1, wherein one of the microsized epitaxial optoelectronic semiconductor elements is a light-emitting element and one of the microsized epitaxial optoelectronic semiconductor elements is a light-receiving element.

6. The optoelectronic semiconductor device as recited in claim 1, wherein when a first voltage is provided for the microsized epitaxial optoelectronic semiconductor element, the microsized epitaxial optoelectronic semiconductor element is operated as a light-emitting element, when a second voltage is provided for the microsized epitaxial optoelectronic semiconductor element, the microsized epitaxial optoelectronic semiconductor element is operated as a light-receiving element, and the first voltage and the second voltage have opposite polarities.

7. The optoelectronic semiconductor device as recited in claim 6, wherein the light-emitting element and the light-receiving element are disposed on a same plane and are horizontally adjacent to each other.

8. The optoelectronic semiconductor device as recited in claim 1, wherein each of the microsized epitaxial optoelectronic semiconductor elements includes a first electrode and a second electrode, the matrix circuit includes a plurality of third electrodes and a plurality of fourth electrodes, the first electrodes are electrically connected with the third electrodes respectively, and the second electrodes are electrically connected with the fourth electrodes respectively.

9. The optoelectronic semiconductor device as recited in claim 1, further comprising:
a photoluminescence layer disposed on a side of the cut native epitaxial wafer away from the microsized epitaxial optoelectronic semiconductor elements.

10. The optoelectronic semiconductor device as recited in claim 9, wherein the photoluminescence layer is a quantum dots structure layer or a phosphor layer.

11. The optoelectronic semiconductor device as recited in claim 9, further comprising:
a filter substrate disposed on a side of the photoluminescence layer away from the cut native epitaxial wafer.

12. The optoelectronic semiconductor device as recited in claim 11, wherein the filter substrate includes a plurality of filter portions, which correspond to the microsized epitaxial optoelectronic semiconductor elements respectively.

13. The optoelectronic semiconductor device as recited in claim 1, further comprising: a photoluminescence layer disposed on a side of the cut native epitaxial wafer away from the microsized epitaxial optoelectronic semiconductor elements.

14. The optoelectronic semiconductor device as recited in claim 13, wherein the photoluminescence layer is a quantum dots structure layer or a phosphor layer.

15. The optoelectronic semiconductor device as recited in claim 13, further comprising:
a filter substrate disposed on a side of the photoluminescence layer away from the cut native epitaxial wafer.

16. The optoelectronic semiconductor device as recited in claim 15, wherein the filter substrate includes a plurality of filter portions, which correspond to the microsized epitaxial optoelectronic semiconductor elements respectively.

17. The optoelectronic semiconductor device as recited in claim 7, wherein the optoelectronic semiconductor device is applied for recognition of a fingerprint having an uneven print, wherein the light-emitting element is configured to emit a light to the uneven print of the fingerprint, and the light-receiving element is configured to receive the light reflected from the uneven print of the fingerprint to generate current values.

18. The optoelectronic semiconductor device as recited in claim 1, wherein the cut native epitaxial wafer has an opposite surface facing away from the microsized epitaxial optoelectronic semiconductor elements, the cut native epitaxial wafer is a protection cover of the optoelectronic semiconductor device, and the opposite surface is an outward surface of the protection cover of the optoelectronic semiconductor device.

19. The optoelectronic semiconductor device as recited in claim 18, wherein the microsized epitaxial optoelectronic semiconductor elements include:
a first microsized epitaxial optoelectronic semiconductor element, operated as a light-emitting element applied with a first voltage within a first time period, and operated as a light-receiving element applied with a second voltage within a second time period, wherein the first voltage and the second voltage have opposite polarities; and
a second microsized epitaxial optoelectronic semiconductor element, operated as a light-receiving element applied with the first voltage within the first time period, and operated as a light-emitting element applied with the second voltage within the second time period,
wherein the optoelectronic semiconductor device is applied for recognition of a fingerprint having an uneven print, the opposite surface of the cut native epitaxial wafer faces the uneven print, the light-emitting element is configured to emit a light through the cut native epitaxial wafer to the uneven print of the fingerprint, and the light-receiving element is configured to receive the light reflected from the uneven print of the fingerprint through the cut native epitaxial wafer to generate current values.

20. An optoelectronic semiconductor device, comprising:
a cut wafer;
a plurality of microsized epitaxial optoelectronic semiconductor elements, disposed separately and directly on a surface of the cut wafer, wherein a length of a side of each of the microsized epitaxial optoelectronic semiconductor elements is between 1 μm and 100 μm, and a minimum interval on the cut wafer between two adjacent microsized epitaxial optoelectronic semiconductor elements is 1 μm; and
a circuit substrate, opposite to the cut wafer and facing the plurality of the microsized epitaxial optoelectronic semiconductor elements, wherein the microsized epitaxial optoelectronic semiconductor elements are between the circuit substrate and the cut wafer,
wherein the cut wafer has an opposite surface facing away the microsized epitaxial optoelectronic semiconductor elements, the cut wafer is a protection cover of the optoelectronic semiconductor device, and the opposite surface is an outward surface of the protection cover of the optoelectronic semiconductor device,
wherein the microsized epitaxial optoelectronic semiconductor elements includes:

a first microsized epitaxial optoelectronic semiconductor element, operated as a light-emitting element applied with a first voltage within a first time period, and operated as a light-receiving element applied with a second voltage within a second time period, wherein the first voltage and the second voltage have opposite polarities; and a second microsized epitaxial optoelectronic semiconductor element, operated as a light-receiving element applied with the first voltage within the first time period, and operated as a light-emitting element applied with the second voltage within the second time period, wherein the optoelectronic semiconductor device is applied for recognition of a fingerprint having an uneven print, the opposite surface of the cut wafer faces the uneven print, the light-emitting element is configured to emit a light through the cut wafer to the uneven print of the fingerprint, and the light-receiving element is configured to receive the light reflected from the uneven print of the fingerprint through the cut wafer to generate current values.

\* \* \* \* \*